(12) United States Patent
Ohkubo et al.

(10) Patent No.: US 6,374,616 B2
(45) Date of Patent: Apr. 23, 2002

(54) HEAT EXCHANGER

(75) Inventors: Hideaki Ohkubo; Norio Takahashi; Tetsuo Ohnishi, all of Hiratsuka (JP)

(73) Assignees: Komatsu Ltd., Tokyo; Komatsu Electronics Inc., Hiratsuka, both of (JP)

( * ) Notice: Subject to any disclaimer, the term of this patent is extended or adjusted under 35 U.S.C. 154(b) by 0 days.

(21) Appl. No.: 09/740,844

(22) Filed: Dec. 21, 2000

(30) Foreign Application Priority Data

Dec. 22, 1999 (JP) .......................................... 11-364531

(51) Int. Cl.⁷ ........................... F25B 21/02; H01L 35/28
(52) U.S. Cl. ........................................ 62/3.7; 136/204
(58) Field of Search .............................. 62/3.2, 3.3, 3.7; 136/204

(56) References Cited

U.S. PATENT DOCUMENTS

| | | | | |
|---|---|---|---|---|
| 3,138,934 A | * | 6/1964 | Roane | 62/3.3 |
| 3,601,887 A | * | 8/1971 | Mitchell | 29/573 |
| 5,409,547 A | * | 4/1995 | Watanabe et al. | 136/204 |
| 5,956,569 A | * | 9/1999 | Shiu et al. | 438/48 |
| 5,987,893 A | * | 11/1999 | Schulz-Harder et al. | 62/3.7 |
| 6,233,944 B1 | * | 5/2001 | Yamada et al. | 62/3.7 |

* cited by examiner

Primary Examiner—William C. Doerrler
(74) Attorney, Agent, or Firm—Varndell & Varndell, PLLC

(57) ABSTRACT

A heat exchanger for executing heat exchange between heat exchange between heat exchange bodies (6) on a heat radiation side and heat exchange bodies (3) on a heat absorption side, having low thermal resistance and high performance of heat conduction includes heat exchange bodies 6 on a heat radiation side and heat exchange bodies 3 on a heat absorption side, each being disposed hierarchically, thermoelectric conversion element modules 2 interposed between the heat exchange body 6 on the heat radiation side and the heat exchange body 3 on the heat absorption side through an insulating coat 16, and having a plurality of thermoelectric conversion elements 12, 13, wherein the insulating coat 16 is formed integrally on a surface of at least one of the heat exchange body 6 on the heat radiation side and the heat exchange body 3 on the heat absorption side, and a metal coat 17 keeping electric contact with a surface of the thermoelectric conversion elements 12, 13 on either the heat radiation side or the heat absorption side is integrally formed on the insulating coat 16.

6 Claims, 6 Drawing Sheets

HEAT EXCHANGER

BACKGROUND OF THE INVENTION

1. Field of the Invention

This invention relates to a heat exchanger for conducting heat-exchange by using a thermoelectric conversion element.

2. Description of the Related Art

A heat exchanger for temperature-controlling a cooling medium or a chemical solution by using thermoelectric conversion elements is known. FIG. 6 of the accompanying drawings is a sectional view of a heat exchanger disclosed in Japanese Patent Laid-Open Publication No. 242022/1996.

In the drawing, the heat exchanger 1 includes a heat-absorbing body 3 made of aluminum, heat radiation fins 19 and electronic cooling element groups 2 (hereinafter called "thermoelectric conversion element modules") sandwiched between the heat absorbing body 3 and the heat radiation fins 19. The thermoelectric heat conversion element module 2 includes a large number of p- and n-type thermoelectric conversion elements 12 and 13 that are mutually connected by electrodes 20 on a heat absorption side and electrodes 14 on a heat radiation side, each made of copper, for example.

Thin insulating layers 16 each made of alumina are formed by anodic oxidation on the surface of the heat absorbing body 3 and the heat radiation fins 19 that oppose the thermoelectric conversion element module 2 in order to insulate mutually the electrodes 14, 14 on the heat radiation side and the electrodes 20 and 20 on the heat absorption side. Silicon grease 21 or an adhesive having high thermal conductivity is interposed between the insulating layer 16 and the electrode 14 and between the insulating layer 16 and the electrode 20.

When a current is caused to flow through the thermoelectric conversion element module 2 in such a heat exchanger 1, a temperature difference occurs between the electrodes 14 and 20 of the thermoelectric conversion element module 2, and heat exchange is executed between the heat absorbing body 3 and the heat radiation fins 19.

However, this prior art technology is not yet free from the following problems.

The grease 21 or the adhesive is interposed between the insulating layer 16 and the electrode 14 and between the insulating layer 16 and the electrode 20. Though the grease 21 or the adhesive has higher thermal conductivity than that of the ordinary type, its thermal resistance is greater than those of the insulating layer 16 and the metals. In other words, its thermal resistance is high, so that a heat loss develops during heat exchange and heat exchange efficiency decreases.

In consequence, performance of the heat exchangeability decreases, and the heat exchanger fails to control the cooling medium or the chemical solution to a desired temperature or needs greater electric power so as to control them to a desired temperature.

SUMMARY OF THE INVENTION

To solve the problems described above, it is an object of the present invention to provide a heat exchanger having small thermal resistance but high efficiency.

In a heat exchanger for executing heat exchange between heat exchange bodies on a heat radiation side and heat exchange bodies on a heat absorption side, the first invention of this invention for accomplishing the object described above includes the heat exchange bodies on the heat radiation side and the heat exchange bodies on the heat absorption side each being disposed hierarchically, and thermoelectric conversion element modules, each being interposed between the heat exchange body on the heat radiation side and the heat exchange body on the heat absorption side through an insulating coat, and having a plurality of thermoelectric conversion elements, wherein the insulating coat is formed integrally on a surface of the heat exchange bodies on at least one of the heat radiation side and the heat absorption side, and a metal coat keeping electric contact with the surface of the thermoelectric conversion elements on either the heat radiation side or the heat absorption side is integrally formed on the insulating coat.

According to the first invention, the insulating coat and the metal coat are integrally formed on the surface of the heat exchange bodies on at least one of the sides, and the thermoelectric conversion elements are brought into electric contact. In this way, coupling can be achieved without applying a material having low thermal conductivity such as grease to the contact surface between the heat exchange body and the thermoelectric conversion element. Therefore, heat does not pass through the material having low thermal conductivity, and adhesion between them can be improved, lowering thereby thermal resistance. In other words, the heat exchanger has improved performance of heat conduction and can execute more efficiently heat exchange with lower power consumption. The heat exchanger can also execute accurately temperature control.

In the heat exchanger of the first invention described above, the second invention of this invention employs a construction in which electrodes of opposing thermoelectric conversion element modules are fixed to the metal coat formed integrally on the insulating coat.

According to the second invention, the electrodes of the thermoelectric conversion element modules that are produced separately are fixed to the insulating coat and the metal coat formed integrally with the heat exchange body. In other words, it is technically difficult to form the metal coat, to be formed on the insulating coat, to a thickness sufficient for use as the electrode of the thermoelectric conversion element module, and the cost is high, too. Therefore, the production of the heat exchanger becomes easier when the electrodes are separately produced and are fixed to the metal coat.

Since both electrodes and metal coat are made of metal, they can be fixed to each other while keeping high adhesion and thermal resistance is small on their contact surface. Moreover, when fixing is made by metal fusion such as soldering, for example, the solder is a metal and has high thermal conductivity, and can firmly couple them together. In consequence, the thermal contact resistance becomes smaller at the contact positions between the heat exchange body and the thermoelectric conversion element module, performance of heat conduction of the heat exchanger can be improved, and heat exchange can be executed more efficiently with smaller power consumption. When temperature control is conducted in this heat exchanger, control can be conducted more accurately.

Soldering is carried out at a relatively low temperature and does not invite problems such as thermal deformation of the heat exchange body and peel of brazing inside the heat exchange body. Therefore, fixing can be conducted with high reliability.

The heat exchanger according the third invention provides a heat exchanger wherein the heat exchange body on the heat radiation side and the electrode on the heat radiation side are fixed to one another by soldering, grease having high thermal conductivity is interposed between the heat exchange body on the heat absorption side and the electrode on the heat absorption side, and they are then brought into adhesion with one another.

According to the third invention, the heat exchange body on the heat radiation side and the electrode on the heat radiation side are fixed to one another by soldering, and grease having high thermal conductivity is interposed between the heat exchange body on the heat absorption side and the electrode on the heat absorption side. The effect brought forth by fixing and soldering the heat exchange body on the heat radiation side and the electrode on the heat radiation side is the same as that of the second invention.

When the heat exchanger cools a chemical solution, or the like, flowing through the heat exchange body on the heat absorption side, calories (heat) flowing from the thermoelectric conversion element module to the heat exchange body on the heat radiation side becomes greater than calories (heat) flowing from the heat exchange body on the heat absorption side to the thermoelectric conversion element module. Therefore, soldering is made on the side in which the flowing calories are greater, so as to improve adhesion of that portion. In consequence, the thermal resistance can be reduced.

The heat exchange body on the heat absorption side and the thermoelectric conversion element module are brought into mutual contact while interposing grease between them, and are allowed to slide while keeping their adhesion. Even when the temperature difference becomes great between the heat exchange body on the heat radiation side and the heat exchange body on the heat absorption side and the degrees of their expansion becomes different, the heat exchange body on the heat absorption side and the thermoelectric conversion element module are slidable due to the grease. Consequently, since any force causing distortion of the thermoelectric conversion element modules does not act, the thermoelectric conversion element module is not broken and performance of thermal conduction does not decrease, either.

DESCRIPTION OF THE PREFERRED EMBODIMENTS

Figure 1:
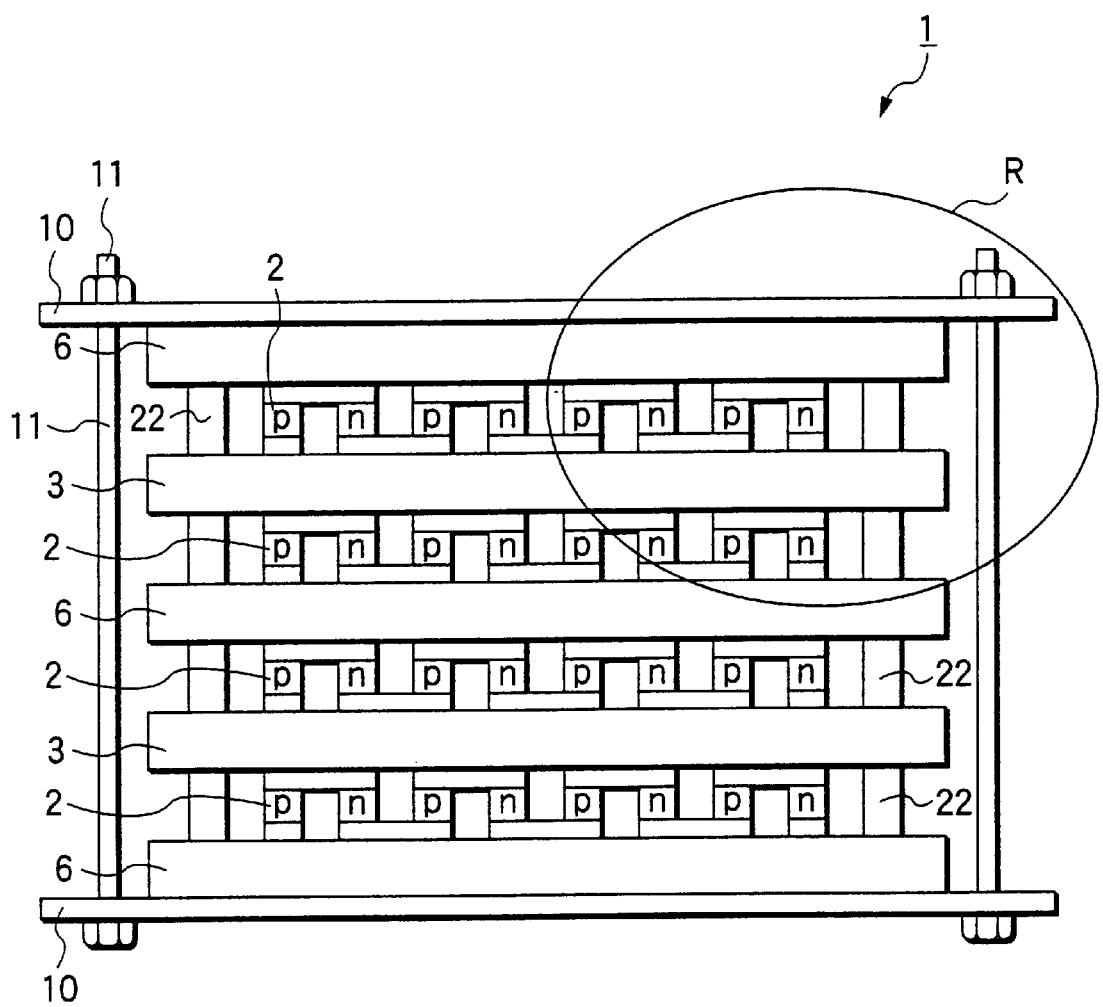
FIG. 1 is a side view of a heat exchanger according to a first embodiment of the present invention.

Preferred embodiments of the present invention will be explained in detail with reference to the accompanying drawings. Incidentally, like reference numerals will be used in the description of the embodiments that follow, to identify like constituent elements as used in the explanation of the prior art example and the embodiments of the invention described above, and repetition of the explanation of such elements will be omitted.

Figure 2:
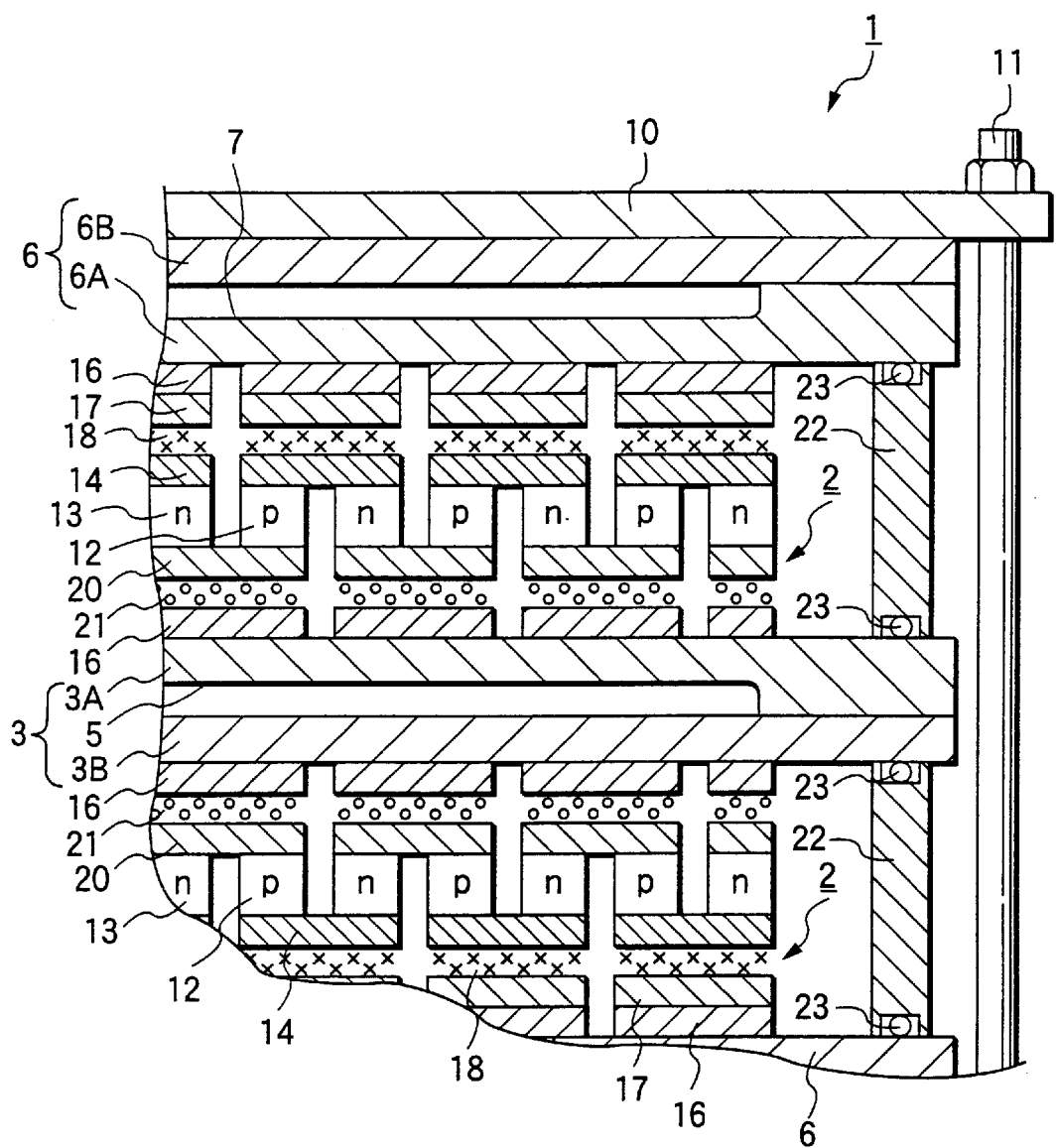
FIG. 2 is a detailed sectional view of a portion R in FIG. 1.

The first embodiment of the invention will be explained initially. FIG. 1 is a side view of a heat exchanger 1 according to the first embodiment and FIG. 2 is a detailed sectional view of a portion R of the heat exchanger.

As shown in the drawing, the heat exchanger 1 of this embodiment includes heat exchange bodies 6 on the heat radiation side each having therein a cooling flow passage 7 for the passage of cooling water, and heat exchange bodies 3 on the heat absorption side each having therein a chemical solution flow passage 5 for the passage of a chemical solution.

The heat exchange bodies 6 on the heat radiation side and the heat exchange bodies 3 on the heat absorption side are disposed alternately and hierarchically.

Each of these heat exchange bodies 3 and 6 comprises a metal block 3A, 6A made of copper or a copper alloy and a plate 3B, 6B each having high thermal conductivity. As the plate 3B, 6B is put into a groove formed in the surface of the block 3A, 6A, each flow passage 5, 7 is formed.

Thermoelectric conversion element modules 2, that are formed by arranging a plurality of thermoelectric conversion elements 12, 13 into a module, are interposed between the heat exchange bodies 6 on the heat radiation side and the heat exchange bodies 3 on the heat absorption side. A large number of p- and n-type thermoelectric conversion elements 12 and 13 are coupled by soldering, for example, to electrodes 14 on the heat radiation side, such as a copper plate, and to electrodes 20 on the heat absorption side to compose the thermoelectric conversion element modules 2. When a current is caused to flow from a control circuit, not shown, a temperature difference is created between the electrode 14 on the heat radiation side and the electrode 20 on the heat absorption side so that heat exchange can be effected between the heat exchange body 6 on the heat radiation side and the heat exchange body 3 on the heat absorption side.

Incidentally, the term "heat absorption side" used herein means, irrespective of cooling or heating, the side in which a fluid flowing inside is controlled to a predetermined temperature by the thermoelectric conversion element module 2 and the term "heat radiation side" means the side in which heat generated by the heat exchange by the thermoelectric conversion element module 2 is thrown away.

A thin electric insulating coat 16 of alumina as an insulator is formed by plasma spraying, for example, on the surface of the thermoelectric conversion element module 2 of the heat exchange bodies 6 on the heat radiation side in such a manner as to correspond to the portions where the electrodes 14 on the heat radiation side come into contact. The insulating coat 16 is formed so as to avoid mutual short-circuit between the electrodes 14 on the heat radiation side.

Plasma spraying is a technical method that melts a powder material (here, alumina), converts it to a plasma jet and causes the plasma jet to impinge against a work (here, copper or the copper alloy of the surface of the heat exchange body 6 on the heat radiation side). When the material is cooled and solidified on the work, it forms the coat. The work and the coat are firmly coupled to each other by the anchor effect and metal bonds etc.

A thin coat 17 of copper, a copper alloy or nickel (hereinafter called the "metal coat") is formed on the surface of the insulating coat 16 by plasma spraying described above, or other metallizing means for example heating and melting a copper paste on the surface of the insulating coat 16.

In this case, the insulating coat 16 may be formed on the entire surface of the heat exchange body 6 on the heat radiation side, while the metal coat 17 may be formed at portions where the electrodes 14 on the heat radiation side come into contact.

The metal coat 17 formed over the surface of the heat exchange body 6 on the heat radiation side through the insulating coat 16 and the electrode 14 on the heat radiation side are fixed to each other by soldering, forming thereby a solder layer 18 between them.

The alumina insulating coat 16 is formed by plasma spraying on the surface of the heat exchange body 3 on the heat-radiation side on its side facing the thermoelectric conversion element module 2 at those portions with which the electrodes 20 on the heat absorption side come into contact. Grease 21 having high thermal conductivity is interposed between the electrode 20 on the heat absorption side and the insulating coat 16 so as to improve adhesion and to bring them into mutual contact. Powder of ceramics or metals and fibers are preferably mixed with this grease 21 to improve thermal conductivity.

During operation, cooling water flows through the cooling flow passage 7 of the heat exchange body 6 on the heat radiation side and its temperature is from several to about 30° C., whereas the temperature of the heat exchange body 3 on the heat absorption side is with in abroad range of from −20 to 80° C. as the thermoelectric conversion element module 2 executes heating or cooling. In other words, since the temperature difference is great between the heat exchange body 3 on the heat absorption side and the heat exchange body 6 on the heat radiation side, the heat exchange bodies 3 and 6 on only one side undergo great expansion or contraction.

Therefore, if all the heat exchange body 3 on the absorption side, the thermoelectric conversion element module 2 and the heat exchange body 6 on the heat radiation side are fixed, the thermoelectric conversion element module 2 will undergo distortion or peel of soldering will occur due to the difference of the degrees of expansion. To avoid this problem, the grease 21 is interposed between the heat exchange body 3 on the heat absorption side and the thermoelectric conversion element module 2 so as to make them slidable. In other words, although they adhere to each other, the heat exchange body 3 on the heat absorption side and the thermoelectric conversion element module 2 are allowed to be slidable relative to each other. Incidentally, the insulating coat 16 may be formed in this case on the entire surface of the heat exchange body 3 on the heat absorption side.

In a heat exchanger 1 of a type that controls the temperature of a chemical solution flowing through the chemical solution flow passage 5 to a temperature from several to about 40° C. in the same way as the temperature of cooling water, the temperature difference between the heat exchange body 6 on the heat radiation side and the heat exchange body 3 on the heat absorption side is not much great. In such a case, therefore, the insulating coat 16 and the metal coat 17 may be formed integrally on the heat exchange body 3 on the heat absorption side in the same way as the heat exchange body 6 on the heat radiation side, and this metal coat 17 may be further soldered to the electrode 20 on the heat absorption side. Since the grease 21 is not at all interposed in this case, the thermal resistance can be reduced more greatly.

Fixing plates 10, 10 are fixed to the outside of each heat exchange body 6, 6 on the heat radiation side. The fixing plates 10 and 10 are then fastened mutually by fastening bolts 11 disposed at four corners in a vertical direction in the drawing. In consequence, adhesion of the heat exchange body 6 on the heat radiation side, the thermoelectric conversion element module 2 and the heat exchange body 3 on the heat absorption side as well as thermal conductivity, can be improved, and heat exchange can be conducted efficiently.

A frame 22 having O-rings 23 is disposed round the entire periphery of the thermoelectric conversion element module 2. The O-rings 23 seal the space round the thermoelectric conversion element module 2 and prevent short-circuit of the thermoelectric conversion element modules 2 due to dewing.

In the embodiment described above, insulating coats 16, 16 are formed integrally by plasma spraying of alumina, for example, on the heat exchange body 6 on the heat radiation side and on the heat exchange body 3 on the heat absorption side. Therefore, the thermal contact resistance between the heat exchange body 6 on the heat radiation side and the heat exchange body 3 on the heat absorption side and between the insulating coats 16 and 16 becomes small.

Metal coats 17, 17 are formed integrally on the insulating coat 16 by plasma spraying or fusing of the copper paste. Therefore, the contact thermal resistance between the metal coat 17 and the insulating coat 16 becomes small, too.

Since the metal coat 17 and the electrode 14 on the heat radiation side are soldered, they can be fixed strongly to each other and the contact thermal resistance becomes small. Moreover, soldering can be conducted at a relatively low temperature of about 200° C., and does not invite thermal deformation of the heat exchange body 6 on the heat radiation side and peel of brazing inside the heat exchange body 6 on the heat radiation side.

Only the materials having high thermal conductivity such as the metal coat 17, the alumina insulating coat 16 and the solder layer 18 are interposed between the electrode 14 on the heat radiation side and the heat exchange body 6 on the heat radiation side, but a material having relatively low thermal conductivity such as the grease is not interposed. Moreover, since these materials having high thermal conductivity are all integrally fixed, they have high adhesion. Consequently, the thermal resistance becomes extremely small between the thermoelectric conversion element module 2 and the heat exchange body 6 on the heat radiation side, and heat exchange can be conducted at high efficiency with smaller power consumption.

The heat exchange body 6 on the heat radiation side and the thermoelectric conversion element module 2 are soldered to each other, while the heat exchange body 3 on the heat absorption side and the thermoelectric conversion element module 2 are brought into close contact while interposing the grease 21 between them.

When the chemical solution flowing through the chemical solution passage 5 is cooled, the relation is formularized by the equation, Q1=Q2+W, where Q1 is the calories moving from the thermoelectric conversion element module 2 to the heat exchange body 6 on the heat radiation side, Q2 is the calories moving from the heat exchange body 3 on the heat absorption side to the thermoelectric conversion element module 2, and W is power consumed by the thermoelectric conversion element module 2. In other words, the greater calories Q1 moves between the thermoelectric conversion element module 2 and the heat exchange body 6 on the heat radiation side that moves between the heat exchange body 3 on the heat absorption side and the thermoelectric conversion element module 2.

Therefore, when the junction state between the thermoelectric conversion element module 2 and the heat exchange body 6 on the heat radiation side, where the greater calories Q1 moves, is improved, the overall thermal resistance can be reduced and the heat exchanger 1 having higher efficiency can be obtained.

Particularly because the heat exchanger 1 using the thermoelectric conversion element module 2 is generally used for cooling the chemical solution, etc, the construction described above can provide a heat exchanger 1 having higher performance of heat conduction.

On the other hand, in the heat exchanger 1 for always heating the chemical solution, for example, the heat exchange body 3 on the heat absorption side and the electrode 20 on the heat absorption side may be soldered to each other, and the heat exchange body 6 on the heat radiation side and the electrode 14 on the heat radiation side may be brought into close contact with one another while interposing the grease 21 between them, on the contrary.

Incidentally, there is the case where the heat absorption side is soldered in the heat exchanger 1 for cooling the chemical solution due to the structural limitation of the heat exchanger 1. In such a case, too, the soldered side can reduce more greatly the thermal resistance than on the side using the grease.

Figure 3:
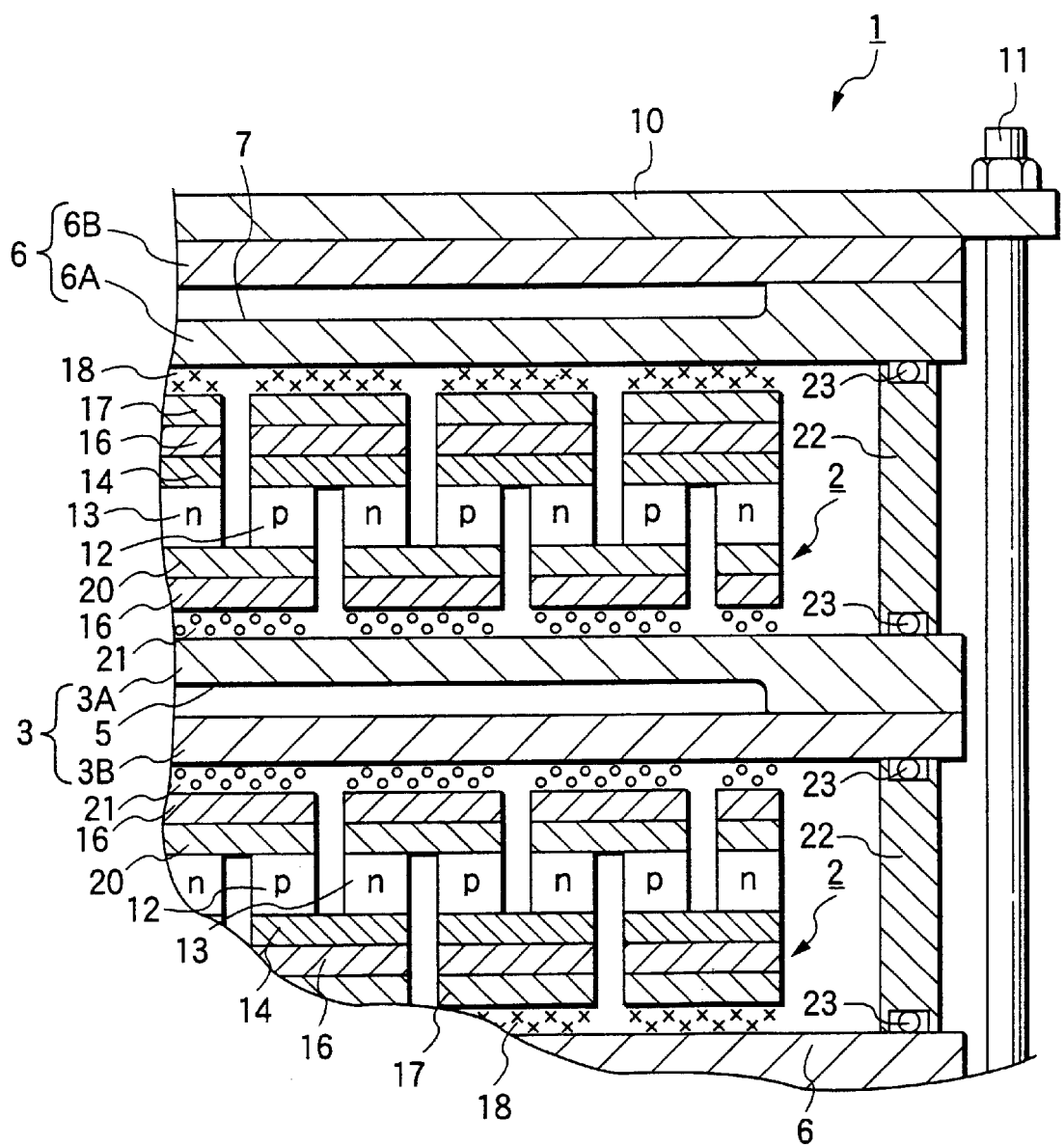
FIG. 3 is a partial sectional view of the heat exchanger.

FIG. 3 shows another example of the embodiment described above. In the heat exchanger 1 shown in the drawing, the insulating coat 16 is formed by plasma spraying, not on the surface of the heat exchange body 6 on the heat radiation side but on the surface of the electrode 14 on the heat radiation side. The metal coat 17 is formed on this insulating coat 16 by plasma spraying or fusing of the copper paste, and the metal coat 17 and the heat exchange body 6 on the heat radiation side are fixed by soldering.

The insulating coat 16 is formed not on the heat exchange body 3 on the heat absorption side but on the surface of the electrode 20 on the heat absorption side. The grease is interposed between the insulating coat 16 and the heat exchange body 3 on the heat absorption side, and these members are brought into mutual contact.

This construction, too, can reduce the thermal resistance between the thermoelectric conversion element module 2 and the electrode 14 on the heat radiation side, and similar effects can be obtained. Furthermore, it is only necessary to form the insulating coat 16 and the metal coat 17 on the entire surface of the electrodes 14 and 20, and the coats 16 and 17 having the shapes corresponding to the shapes of the electrodes 20 and 14 need not be formed on the surface of the heat exchange bodies 3 and 6 as in the embodiment shown in FIG. 2. In other words, the trouble of controlling the shapes of the coats can be saved.

Figure 4:
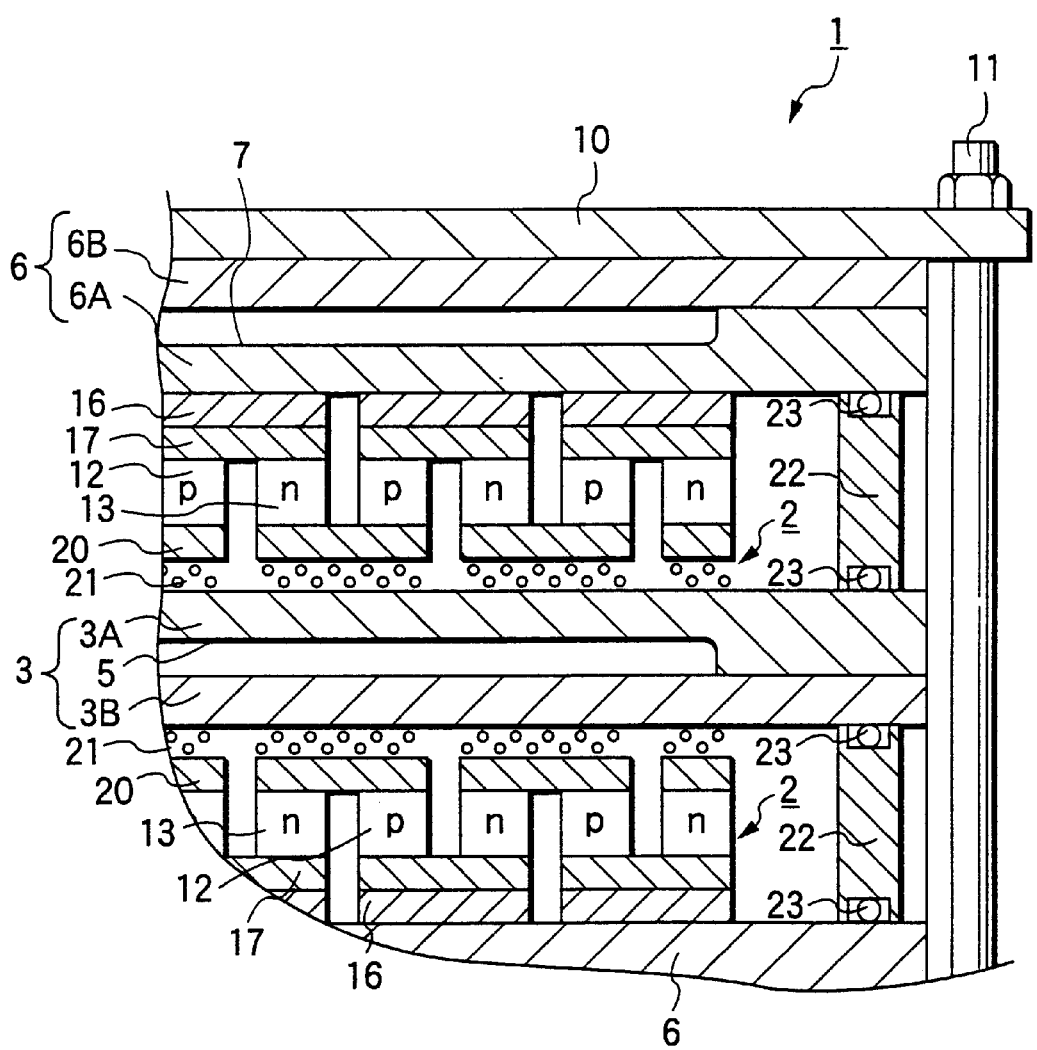
FIG. 4 is a partial sectional view of a heat exchanger according to a second embodiment of the present invention.

FIG. 4 is a partial sectional view of the heat exchanger 1 according to the second embodiment.

In the drawing, an insulating coat 16 of alumina is formed interruptedly by plasma spraying on the surface of a heat exchange body 6 on the heat radiation side. A relatively thick metal coat 17 having a thickness of hundreds of microns to several millimeters is formed on the surface of the insulating coat 16 by plasma spraying or metallizing means such as fusing of a copper paste, or their combination. P- and n-type thermoelectric conversion elements 12 and 13 are aligned on the metal coat 17 and are fixed by soldering. The metal coat 17 is utilized as an electrode on the heat radiation side.

Electrodes 20 on the heat absorption side formed of a copper plate are fixed by soldering to the surface of the p- and n-type thermoelectric conversion elements 12 and 13 opposite to the electrodes on the heat radiation side that are formed of the metal coat 17. The electrodes 20 on the heat absorption side are brought into close contact with heat exchange bodies 3 on the heat absorption sides through grease 21.

In this embodiment, the metal coat 17 formed integrally with the heat exchange bodies 6 on the heat radiation side by means such as plasma spraying or fusion of the copper paste constitutes the electrodes on the heat radiation side. Therefore, the heat exchange body 6 on the heat radiation side and the thermoelectric conversion element module 2 can be brought into closer contact with higher adhesion than by using the soldering means described in the first embodiment, and the thermal resistance can be much more reduced. Since the number of soldering points can be decreased, the problem of the deterioration of adhesion of the contact surface due to inferior soldering does not occur, and reliability of the heat exchanger 1 can be improved.

Figure 5:
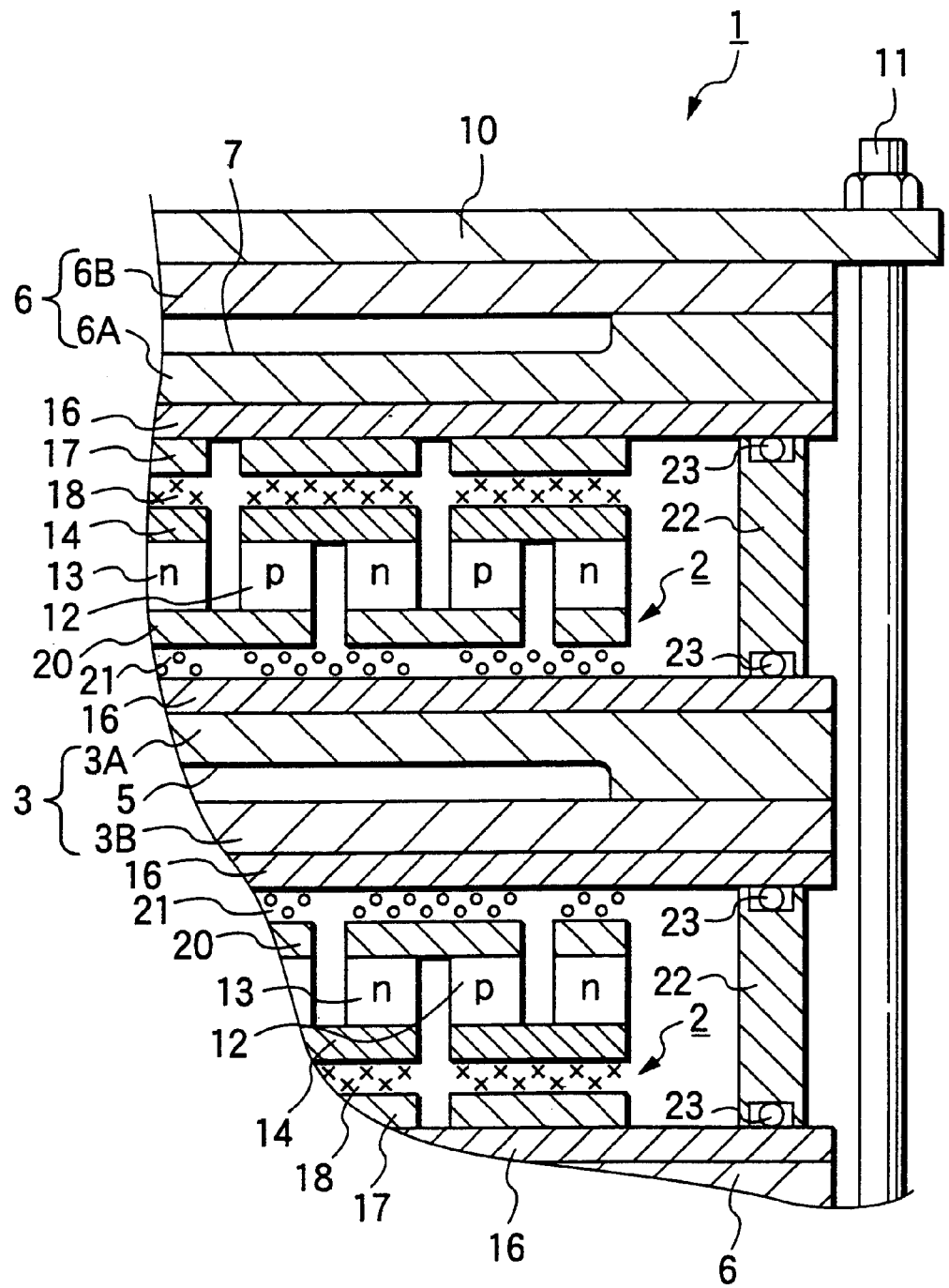
FIG. 5 is a partial sectional view of a heat exchanger according to a third embodiment of the present invention.
Figure 6:
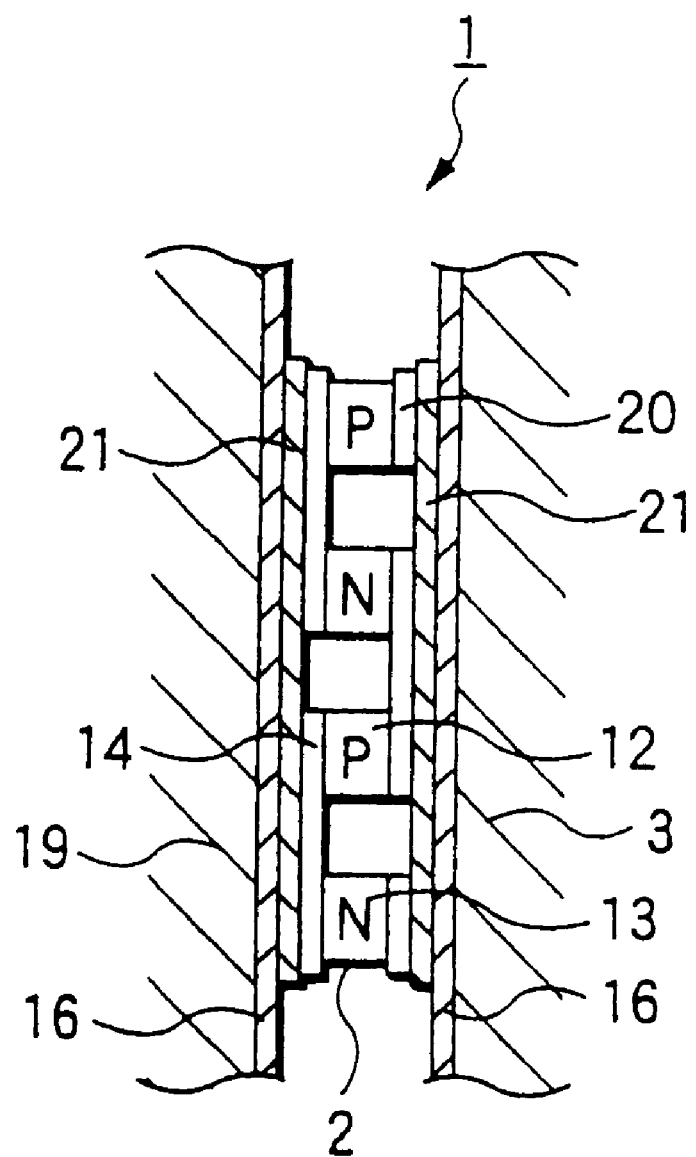
FIG. 6 is a sectional view of a heat exchanger according to the prior art.

FIG. 5 is a partial sectional view of a heat exchanger 1 according to the third embodiment.

Heat exchange bodies 6 on the heat radiation side in this embodiment are formed of an aluminum alloy, and a cooling medium such as an anti-freezing solution is allowed to flow through a cooling flow pass 7 in side the heat exchange body 6. In other words, since water is not allowed to flow inside, the heat exchange body 6 on the heat radiation side is not corroded even when it is formed of the aluminum alloy. The entire surface of the radiation-side heat exchange body 6 on the side of the thermoelectric conversion element module 2 is subjected to anodic oxidation of aluminum, and an insulating coat 16 of alumina is formed consequently.

A metal coat 17 is formed by plasma spraying or fusion of a copper paste on this insulating coat 16 at positions where the electrodes 14 on the discharge side of the thermoelectric conversion element module 2 come into contact. The metal coat 17 and the electrode 14 on the heat radiation side are soldered to each other.

The heat exchange body 3 on the heat absorption side, too, is formed of the aluminum alloy and the insulating coat 16 is formed on its entire surface on the side of the thermoelectric conversion element module 2 by anodic oxidation of aluminum.

The electrode 20 on the heat absorption side of the thermoelectric conversion element module 2 is brought into close contact with the insulating coat 16 through the grease 21.

In this embodiment, the insulating coat 16 of alumina is formed by conducting anodic oxidation of aluminum on the heat exchange body 6 on the heat radiation side and the heat exchange body 3 on the heat absorption side. Anodic oxidation of aluminum is simpler than plasma spraying of aluminum and can save troubles when producing the heat exchanger 1. Since the insulating property can be improved in comparison with the insulating coat 16 of alumina, the heat radiation-side electrodes 14 and 14 of the thermoelectric conversion element module 2 and the heat absorption-side electrodes 20 and 20 do not undergo short-circuit with the result of the improvement in reliability of the heat exchanger 1.

In this case, the heat exchange body 6 on the heat radiation side is not of the type that causes the anti-freezing solution to flow through the cooling flow passage 7. Therefore, even when the heat exchanger 1 is of the air-cooling type equipped with heat radiation fins as in the heat exchanger 1 according to the prior art, the heat exchange body 6 on the heat radiation side can be formed of the aluminum alloy. As explained in this embodiment, therefore, the insulating coat 16 can be applied to the surface of the heat exchange body 6 on the heat radiation side by anodic oxidation of aluminum.

In both first and second embodiments explained above, the heat exchange body 3 on the heat absorption side dos not pass cooling water, and can be formed of the aluminum alloy. Therefore, the insulating coat 16 on the surface of the heat exchange body 3 on the heat absorption side may be formed by anodic oxidation of aluminum in place of plasma spraying explained in each of the foregoing embodiments.

According to the present invention described above, the insulating coat 16 is integrally formed between at least one of the heat exchange body 6 on the heat radiation side and the heat exchange body 3 on the heat absorption side and the thermoelectric conversion element module 2, and the metal coat 17 is formed on this insulating coat 16. Therefore, at least one of the pair of the heat exchange body 6 on the heat radiation side and the thermoelectric conversion element module 2 and the pair of the thermoelectric conversion element module 2 and the heat exchange body 3 on the heat absorption side can be brought into mutual contact with high adhesion without the necessity for interposing a material having low thermal conductivity such as the grease. In other words, adhesion is improved at each contact position and the thermal resistance becomes small. In consequence, efficiency of the heat exchanger 1 can be improved, heat exchange with greater calories can be conducted at smaller power consumption and accurate temperature control becomes possible.

Because the metals are brought into mutual contact, various coupling means other than soldering described in each embodiment are available, and production of the heat exchanger 1 becomes easier.

In the first and second embodiments described above, the heat exchange body 6 on the heat radiation side may be heat radiation fins 19 of an air-cooling type instead of the water-cooling type heat exchange body 6 on the heat radiation side.

Though the heat exchangers 1 described above are of the type that only cool the chemical solution or the cooling medium, they may be applied to the heat exchanger 1 that heats the chemical solution or the cooling medium, by reversing the direction of the current of the thermoelectric conversion element module 2.

Though the material of the electrodes 14 and 20 and the metal coat 17 is copper in the foregoing explanation, other metals having high thermal conductivity and low electric resistance can also be used and platinum, for example, is more preferred.

Furthermore, diffusion bonding, for example, maybe employed as means for forming the insulating coat.

In the present invention, it is possible to use the heat exchange body on the heat absorption side as a placement plate on which a semiconductor wafer is placed and to use it as a temperature regulating plate for cooling or heating the semiconductor wafer.

In this temperature regulating plate, a heat exchange body on the heat radiation side equipped with a cooling water passage is disposed substantially parallel to, and below, the placement plate, and a thermoelectric conversion element module is interposed between them. A semiconductor wafer is placed on the upper surface of the placement plate through a positioning pin or pins. As the thermoelectric conversion element module executes heat exchange, the temperature of the semiconductor wafer is controlled.

In the temperature regulating plate described above, the insulating coat and the metal coat are integrally formed on the surfaces of the heat exchange body on the heat radiation side and the placement plate as explained in the foregoing embodiments. The metal coat on the side of the heat radiation-side heat exchange body and the heat radiation-side electrodes of the thermoelectric conversion element module are fixed by soldering, or the like, and the metal coat on the side of the placement plate and the heat absorption-side electrodes of the thermoelectric conversion element module are brought into close mutual contact through thermal conductive grease. In this way, there can be obtained a placement plate having low contact resistance on the contact surface and high heat transfer efficiency.

What is claimed is:

1. A heat exchanger for executing heat exchange between heat exchange bodies on a heat radiation side and heat exchange bodies on a heat absorption side, including:

said heat exchange bodies on the heat radiation side and said heat exchange bodies on the heat absorption side being disposed alternatively in a parallel relationship; and thermoelectric conversion element modules respectively including a plurality of p- and n-thermoelectric conversion elements, each being interposed between said heat exchange body on the heat radiation side and said heat exchange body on the heat absorption side through an electrical insulating coat, and having a plurality of thermoelectric conversion elements; wherein:

said electrical insulating coat is formed integrally on a surface of the heat exchange bodies on at least one of the heat radiation side and heat absorption side; and a metal coat keeping electric contact with the surface of said thermoelectric conversion elements on either the heat radiation side or the heat absorption side is integrally formed on said electrical insulating coat.

2. A heat exchanger according to claim 1, wherein electrodes of said thermoelectric conversion element modules opposing one another are fixed to said metal coat formed integrally on said electrical insulating coat.

3. A heat exchanger according to claim 2, wherein said heat exchange body on the heat radiation side and said electrode on the heat radiation side are fixed by soldering.

4. A heat exchanger for executing heat exchange between heat exchange bodies on a heat radiation side and heat exchange bodies on a heat absorption side, including:

said heat exchange bodies on the heat radiation side and said heat exchange bodies on the heat absorption side being disposed alternatively in a parallel relationship; and thermoelectric conversion element modules, each being interposed between said heat exchange body on the heat radiation side and said heat exchange body on the heat absorption side through an insulating coat, having a plurality of thermoelectric conversion elements; wherein:

said electrical insulating coat is formed integrally on a surface of the heat exchange bodies on at least one of the heat radiation side and heat absorption side; and a metal coat keeping electric contact with the surface of said thermoelectric conversion elements on either the heat radiation side or the heat absorption side is integrally formed on said electrical insulating coat, said heat exchange body on the heat radiation side and said electrode on the heat radiation side are fixed by soldering, and said heat exchange body on the heat absorption side and said electrode on the heat absorption side are brought into close contact with one another through grease having high thermal conductivity.

5. A heat exchanger according to claim 2, wherein said heat exchange body on the heat absorption side and said electrode on the heat absorption side are brought into close contact with one another through grease having high thermal conductivity.

6. A heat exchanger for executing heat exchange between heat exchange bodies on a heat radiation side and heat exchange bodies on a heat absorption side, including:

said heat exchange bodies on the heat radiation side and said heat exchange bodies on the heat absorption side being disposed parallel to each other; and thermoelectric conversion element modules, each being interposed between said heat exchange body on the heat radiation side and said heat exchange body on the heat absorption side through an electrical insulating coat, and having a plurality of thermoelectric conversion elements; wherein:

said electrical insulating coat is formed integrally on a surface of the heat exchange bodies on at least one of the heat radiation side and heat absorption side;

a metal coat keeping electric contact with the surface of said thermoelectric conversion elements on either the heat radiation side or the heat absorption side is integrally formed on said electrical insulating coat; and electrodes of said thermoelectric conversion element modules opposing one another are fixed to said metal coat formed integrally on said insulating coat by soldering, and said heat exchange body on the heat absorption side and said electrode on the heat absorption side are brought into close contact with one another through grease having high thermal conductivity.

* * * * *